(12) United States Patent
Nakahara

(10) Patent No.: US 12,146,910 B2
(45) Date of Patent: Nov. 19, 2024

(54) TEST SYSTEM, TEST METHOD, AND NON-TRANSITORY COMPUTER READABLE MEDIUM

(71) Applicant: Kioxia Corporation, Tokyo (JP)

(72) Inventor: Kazuhiko Nakahara, Kanagawa (JP)

(73) Assignee: KIOXIA CORPORATION, Minato-ku (JP)

(*) Notice: Subject to any disclaimer, the term of this patent is extended or adjusted under 35 U.S.C. 154(b) by 0 days.

(21) Appl. No.: 18/177,809

(22) Filed: Mar. 3, 2023

(65) Prior Publication Data

US 2023/0400514 A1 Dec. 14, 2023

(30) Foreign Application Priority Data

Jun. 13, 2022 (JP) .................... 2022-095234

(51) Int. Cl.
*G01R 31/3185* (2006.01)
*G01R 31/28* (2006.01)
*G01R 31/317* (2006.01)

(52) U.S. Cl.
CPC . *G01R 31/318508* (2013.01); *G01R 31/2863* (2013.01); *G01R 31/31713* (2013.01)

(58) Field of Classification Search
CPC ........ G01R 31/318508; G01R 31/2863; G01R 31/31713; G01R 31/31907; G01R 31/31908; G11C 2029/5602; G11C 29/06; G11C 29/56008; G11C 29/56016
USPC ...................................................... 714/727
See application file for complete search history.

(56) References Cited

U.S. PATENT DOCUMENTS

| | | | | |
|---|---|---|---|---|
| 5,323,107 A | * | 6/1994 | D'Souza | G01R 31/318533 324/763.01 |
| 6,466,007 B1 | * | 10/2002 | Prazeres da Costa | G01R 31/31926 714/724 |
| 7,042,243 B2 | * | 5/2006 | Matsumoto | G01R 31/2851 324/762.01 |
| 7,327,153 B2 | * | 2/2008 | Weinraub | G01R 31/31917 714/724 |
| 8,718,967 B2 | | 5/2014 | Filler et al. | |
| 11,385,284 B2 | | 7/2022 | Hayasaka | |
| 2010/0163756 A1 | * | 7/2010 | McPeak | G01R 31/31816 714/E11.002 |
| 2010/0182035 A1 | * | 7/2010 | Byun | G11C 29/56 324/762.01 |

(Continued)

FOREIGN PATENT DOCUMENTS

| | | |
|---|---|---|
| JP | 4124345 B2 | 7/2008 |
| JP | 5235202 B2 | 7/2013 |

(Continued)

*Primary Examiner* — James C Kerveros
(74) *Attorney, Agent, or Firm* — Maier & Maier, PLLC

(57) ABSTRACT

According to a certain embodiment, the test system includes a first test board, a test executable integrated circuit, and a first measuring apparatus. A device under test (DUT) is mounted on the first test board. The test executable integrated circuit is mounted on the first test board, and is configured to read firmware stored in the DUT in advance and to test the DUT. The first measuring apparatus instructs the test executable integrated circuit to start a test of the DUT. There are provided the test system, the test method, and the non-transitory computer readable medium, capable of reducing costs required for tests and also of shortening test time.

18 Claims, 14 Drawing Sheets

(56) References Cited

U.S. PATENT DOCUMENTS

| | | |
|---|---|---|
| 2012/0198292 A1 | 8/2012 | Yuzurihara et al. |
| 2014/0253099 A1* | 9/2014 | Han .................. G01R 19/00 |
| | | 324/126 |
| 2021/0125680 A1 | 4/2021 | Malisic et al. |

FOREIGN PATENT DOCUMENTS

| | | |
|---|---|---|
| JP | 2014-503083 A | 2/2014 |
| JP | 2021-043060 A | 3/2021 |

* cited by examiner

TEST SYSTEM, TEST METHOD, AND NON-TRANSITORY COMPUTER READABLE MEDIUM

CROSS REFERENCE TO RELATED APPLICATIONS

This application is based upon and claims the benefit of priority from prior Japanese Patent Application No. P2022-095234 filed on Jun. 13, 2022, the entire contents of which are incorporated herein by reference.

FIELD

Embodiments described herein relate generally to a test system, a test method, and a non-transitory computer readable medium.

BACKGROUND

In semiconductor devices, such as semiconductor memory device, devices have been evaluated from various aspects under various test conditions before being shipped to the market in order to avoid market defects. For example, there have been performed a burn-in test for suppressing occurrence of an initial failures generating, a reliability test for verifying reliability of products, and the like.

DETAILED DESCRIPTION

Figure 1:
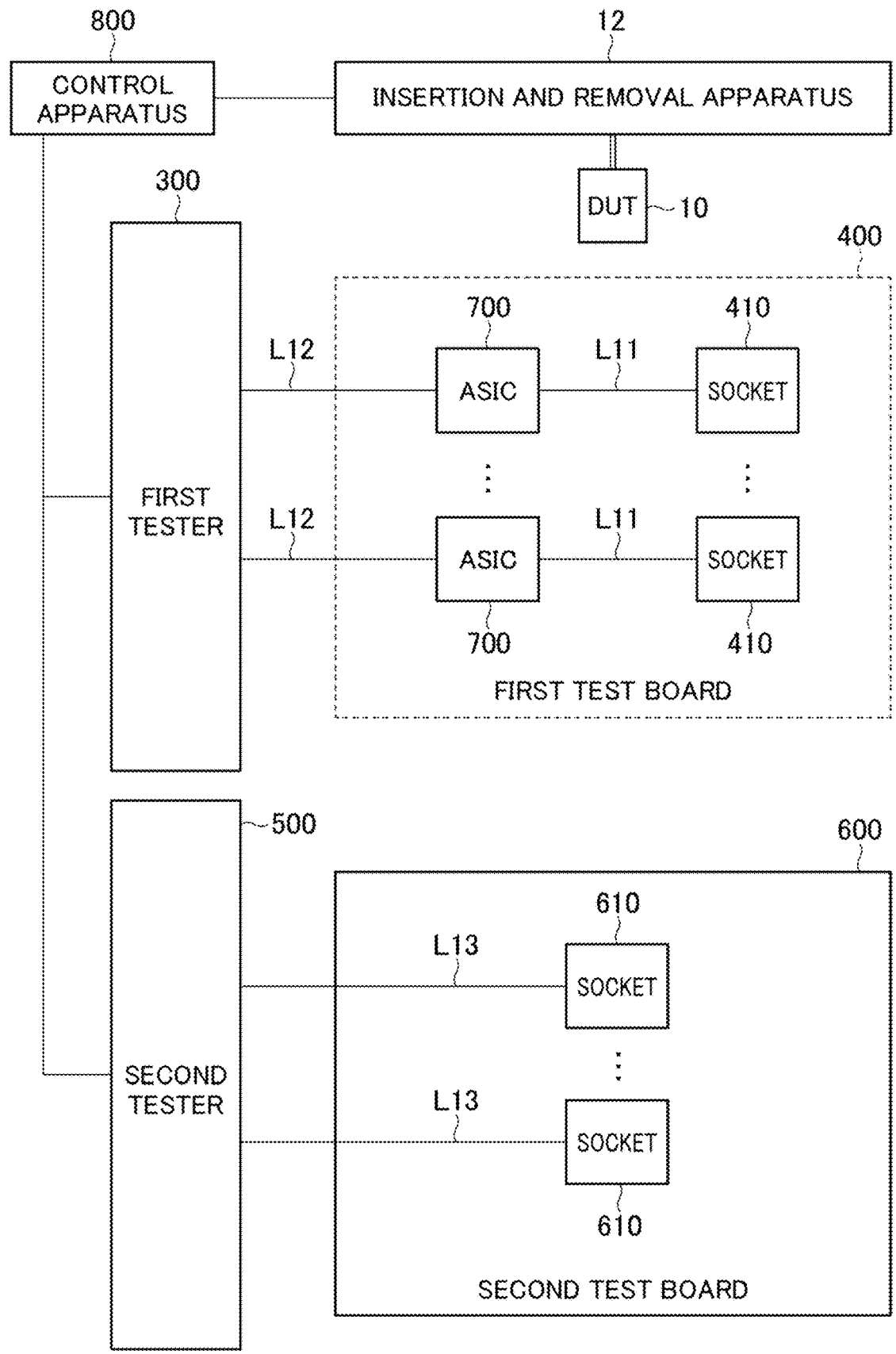
FIG. 1 is a block diagram schematically illustrating an example of a schematic structure of a test system according to the embodiments.

Next, certain embodiments will now be explained with reference to drawings. In the description of the following specification or drawings to be explained, the identical or similar reference sign is attached to the identical or similar part. However, the drawings are merely schematic. Moreover, the embodiments described hereinafter merely exemplify a device and/or a method for materializing the technical idea. The embodiments may be changed without departing from the spirit or scope of claims.

Certain embodiments provide a test system, a test method, and a non-transitory computer readable medium, capable of reducing costs required for tests and also of shortening test time.

According to one embodiment, a test system includes a first test board, a test executable integrated circuit, and a first measuring apparatus. A device under test (DUT) is mounted on the first test board. The test executable integrated circuit is mounted on the first test board, and is configured to read firmware stored in the DUT in advance and to test the DUT. The first measuring apparatus instructs the test executable integrated circuit to start a test of the DUT.

(Test System)

Measuring apparatuses (hereinafter also referred to as testers) for testing a Device Under Test (DUT), such as a semiconductor memory device, generally include burn-in test dedicated testers and ordinary general-purpose memory testers. In the embodiments disclosed herein, the burn-in test dedicated tester is referred to as a first tester and the general-purpose memory tester is referred to as a second tester.

There are, for example, an Alternating Current (AC) test, a Direct Current (DC) test, a functional test, and the like in the tests of semiconductor memory devices. The AC test is a test of Alternating Current (AC) items, such as a signal propagation delay time. The direct current (DC) test is a test of Direct Current (DC) items, such as a voltage value and a current value. The functional test is a test, for example, for verifying that a logic function built into a semiconductor memory device is correctly operates in accordance with specifications. Among the DC test, the AC test, and the functional test, the functional test has the largest number of test items, and therefore also has longer time required for the test.

Although the second tester can execute various tests such as the DC test, the AC test, the functional test in a general-purpose manner, since the measuring apparatus itself is expensive, the cost required for the tests is also increased.

In contrast, although the first tester can reduce is less costly than the second tester, it tends to be inferior in function and performance thereof, and therefore the functional test which can be executed on the first tester is limited to some test items. In general semiconductor memory devices (e.g., NAND flash memories), since a sufficient functional test cannot be executed solely by the first tester, the general-purpose second tester is used together in order to realize execution of the test using functions of the tester itself. In order to solve such a problem, for example, in some products in which an Application-Specific Integrated Circuit (ASIC) is mounted inside a semiconductor memory device, low-cost test execution has been attempted by combining the first tester with the ASIC mounted in the semiconductor memory device and firmware for operating the ASIC. In this case, a new and different problem arises as to how to store the firmware in the semiconductor memory device serving as a DUT.

Firmware for operating the ASIC is necessary to be written while the DUT and the ASIC are connected to each other through a wiring substrate or the like. Therefore, it is necessary to provide a dedicated wiring for the ASIC to communicate with the outside (e.g., the first tester) when writing the firmware. However, when a test is executed using a large number of ASICs in parallel simultaneously, the number of signal wirings required for the communication with the ASIC becomes enormous, resulting in problems such as increased costs due to larger and more expensive testers and deteriorated test efficiency due to lower communication rates.

The firmware for operating the ASIC is written by one of the following methods: a method of writing the firmware directly to a RAM on the ASIC from the first tester through a host bus (Route 1); or a method of writing the firmware to the semiconductor memory device from the first tester through a memory bus wiring and further via the ASIC through a host bus wiring (Route 2). In both cases, Route 1 and Route 2, it is necessary to connect between all DUTs and the first testers by the host bus wiring, and thereby increasing the number of host bus wirings. Moreover, since high-speed transmission is required depending on a standard of the host bus, high-speed transmission is required to be designed and specified also for the first tester and the wiring route thereof.

(Test System in Embodiments)

A test system in the embodiments is a system for testing DUTs, such as semiconductor memories, using a test executable integrated circuit such as ASIC and firmware for operating the test executable integrated circuit. The test system in the embodiments stores the firmware in the DUT in advance to be combined with a dedicated test board on which a test executable integrated circuit is mounted, thereby realizing a test that reduces the cost and time required for the test.

FIG. 1 schematically illustrates an example of a schematic structure of a test system according to the embodiments. As illustrated FIG. 1, the test system according to the embodiments includes: a first test board 400 on which a DUT 10 is mounted; a test executable integrated circuit (e.g., an ASIC) 700 mounted on the first test board 400 and configured to read firmware (e.g., a test program) stored in advance in the DUT 10 and to execute a test of the DUT 10; and a first measuring apparatus (e.g., a first tester) 300 configured to instruct to start the test of the DUT 10 to the test executable integrated circuit (ASIC) 700.

The first tester 300 merely provides the instruction to start test to the ASIC 700, and to test the DUT 10 is the ASIC 700 that receives the instruction from the first tester 300.

The ASIC 700 tests the DUT 10, and writes a test result in the DUT 10 and also reports to the first tester 300 that the test is ended.

Moreover, the test system according to the embodiments includes a second test board 600 on which the DUT 10 is mounted, and a second measuring apparatus (e.g., a second tester) 500 connected to the DUT 10 and configured to write the firmware (e.g., the test program) to the DUT 10 in advance.

Moreover, the test executable integrated circuit 700 is mounted on the first test board 400 in correspondence with the DUT 10. More specifically, one test executable integrated circuit 700 per one DUT 10 is mounted on the first test board 400. Alternatively, it is also possible to mount one test executable integrated circuit 700 on a first test board 400 for a plurality of the DUTs 10.

Moreover, the firmware (e.g., the test program) includes conditions of the test executed for the DUT 10.

Moreover, the test system according to the embodiments further includes an insertion and removal apparatus 12 configured to insert/remove the DUT 10 to/from a test socket 410 arranged on the first test board 400 or a test socket 610 arranged on the second test board 600.

Moreover, the test system according to the embodiments further includes a control apparatus 800 configured to control the first tester 300, the first test board 400, the second tester 500, the second test board 600, the insertion and removal apparatus 12, and the like. The control apparatus 800 includes a pass/fail determination unit (i.e., a pass/fail determination unit 803 illustrated in FIG. 9) configured to determine pass/fail of the DUT 10. The pass/fail determination unit is not limited to be provided in the control apparatus 800, but may also be provided in, for example, the first tester 300 or may also be provided in an external device (not illustrated) or the like.

A test method executed in the test system according to the embodiments may include: mounting a DUT 10 on a second test board 600; and writing firmware (e.g., a test program) to the DUT 10 in advance using a second measuring apparatus (e.g., a second tester) 500 connected to the DUT 10.

Moreover, the test method executed in the test system according to the embodiments includes: mounting a DUT 10 on a first test board 400 on which a test executable integrated circuit (ASIC) 700 is mounted; reading, by the test executable integrated circuit (ASIC) 700, firmware (e.g., a test program) stored in the DUT 10 in advance; instructing, by the first measuring apparatus (first tester) 300, the test executable integrated circuit (ASIC) 700 to start a test of the DUT 10; testing the DUT 10 by the test executable integrated circuit (ASIC) 700; and writing a test result to the DUT 10 by the test executable integrated circuit 700. Furthermore, the test method may include reporting, by a test executable integrated circuit (ASIC) 700, to the first tester 300 that the test of the DUT 10 has been ended.

Moreover, the test method executed in the test system according to the embodiments may also include determining pass/fail of the DUT 10 on the basis of the test result of the DUT by the pass/fail determination unit 803 in the control apparatus 800.

It is to be noted that the processing operations of the present test method can also be described in a computer program as instructions to be executed by computers. The computer program can be stored in non-transitory computer readable media. The computer may be, for example, a Personal Computer (PC), a thin-client terminal, a mobile terminal, a Personal Digital Assistant (PDA), or the like. The non-transitory computer readable medium may be, for example, an external storage device such as a hard disk, a semiconductor storage device such as a memory, a storage medium, or the like. In practice, however, it is not limited to these examples.

(Configuration Example of Test System)

As illustrated in FIG. 1, the test system according to the embodiments includes a first tester 300, a first test board 400 connected to the first tester 300, a second tester 500, a second test board 600 connected to the second tester 500, an insertion and removal apparatus 12 configured to insert/remove a DUT 10 to a socket into/from the first test board 400 or the second test board 600, and a control apparatus 800 configured to control each unit.

Figure 2:
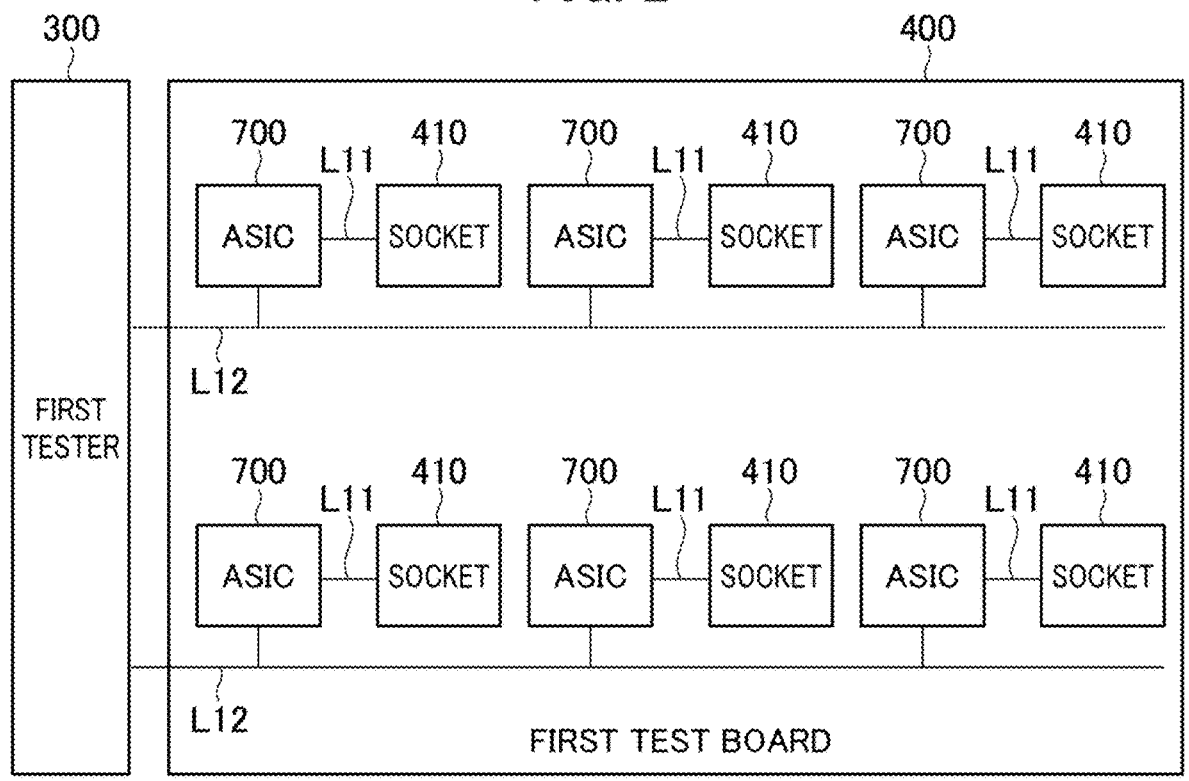
FIG. 2 is a block diagram illustrating an example of a layout of a first test board used for the test system according to the embodiments.
Figure 4:
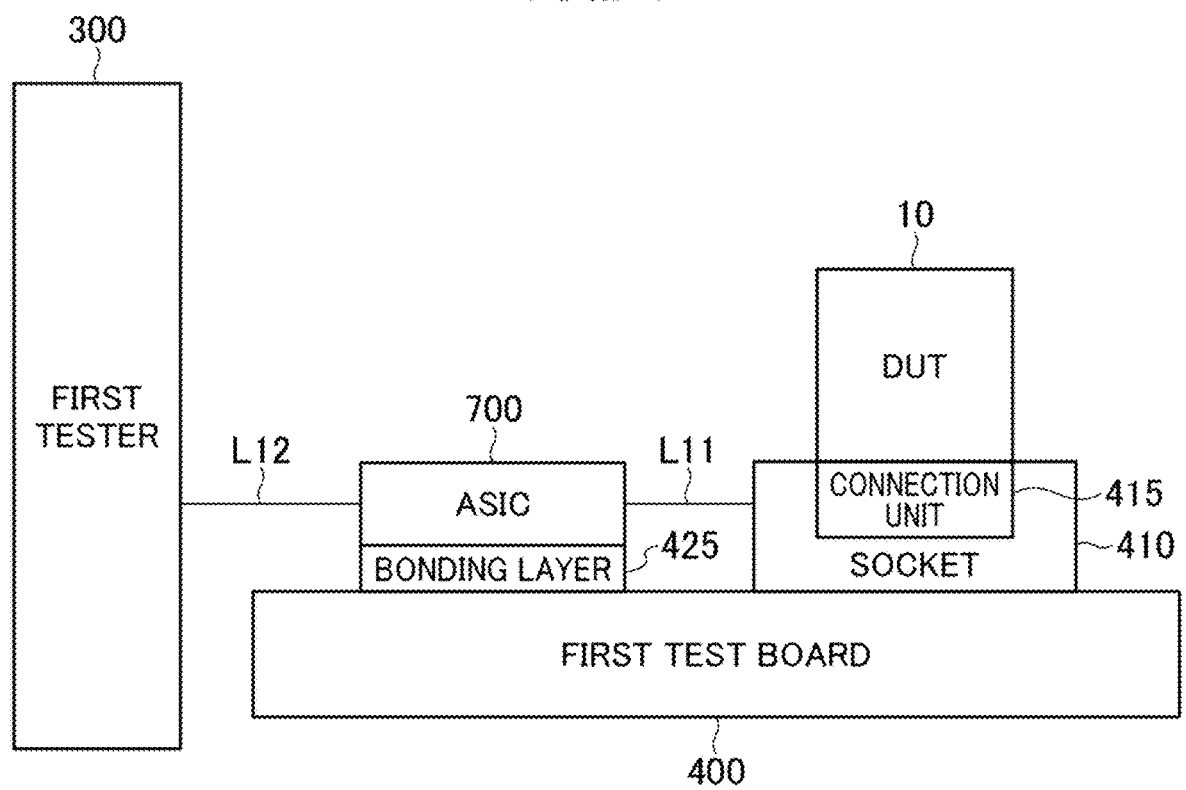
FIG. 4 is a side view diagram illustrating an example of the first test board on which a device under test (DUT) is mounted.

On the first test board 400, a test socket 410 and an ASIC 700 corresponding to the test socket 410 are mounted. The DUT 10, such as a semiconductor memory device, is inserted into the test socket 410 when a test of the DUT 10 is executed. A plurality of pairs of the test socket 410 and the ASIC 700 can be mounted on the first test board 400. As illustrated in FIG. 2, the pairs of the test socket 410 and the ASIC 700 can also be arranged two-dimensionally. In the example illustrated in FIG. 2, although the pairs are arranged in two rows×three columns, the number of the rows and columns is not limited to this example, and the pairs may also be arranged in a matrix of n rows×m columns (where n and m are integers equal to or more than 1). Moreover, as illustrated in FIG. 4, the ASIC 700 is mounted on the first test board 400 via a bonding layer 425, such as a soldering layer. The DUT 10 is inserted into the test socket 410 via a connection unit 415, such as a connection pin.

Figure 3:
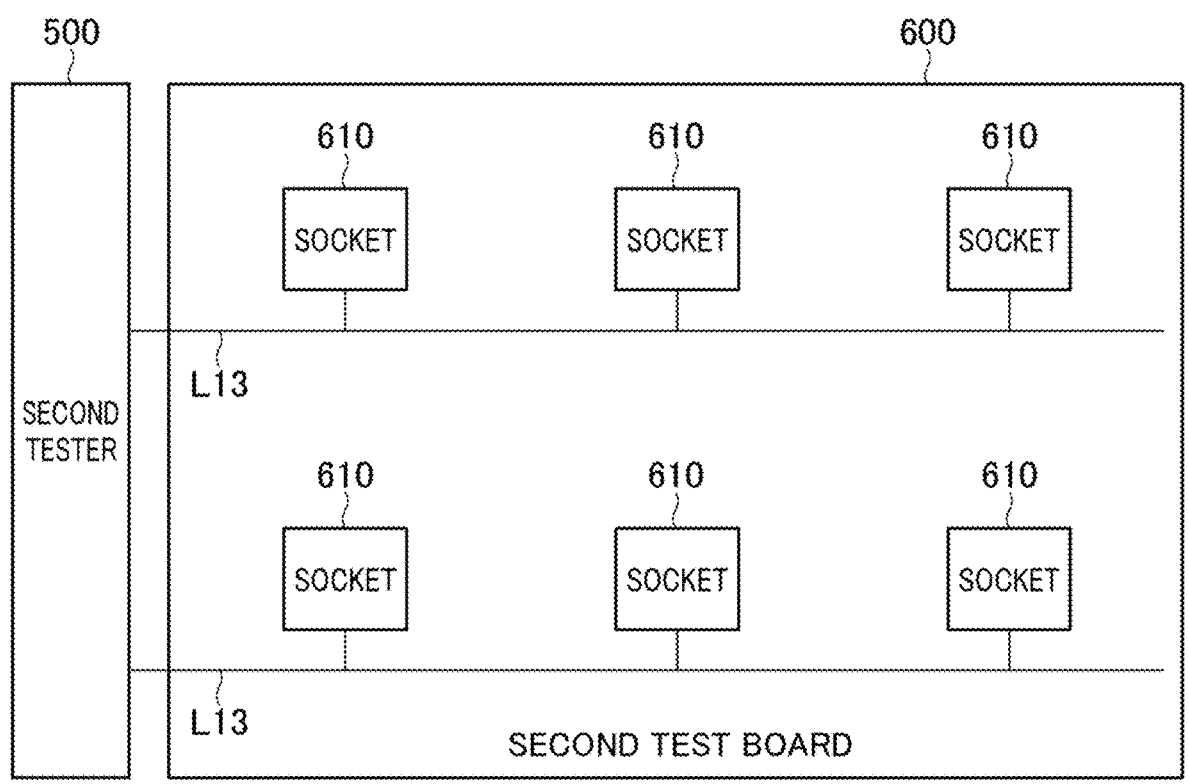
FIG. 3 is a block diagram illustrating an example of a layout of a second test board used for the test system according to the embodiments.
Figure 5:
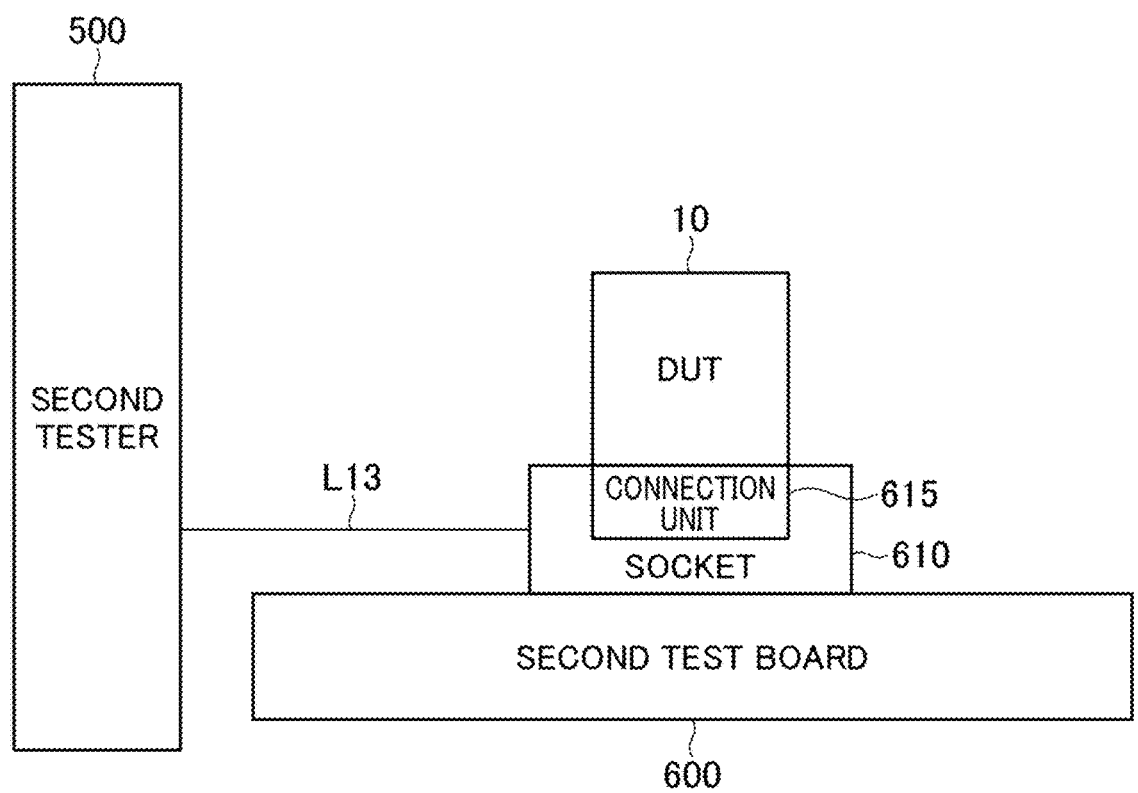
FIG. 5 is a side view diagram illustrating an example of the second test board on which a DUT is mounted.

A test socket 610 is mounted on the second test board 600. The DUT 10, such as a semiconductor memory device, is inserted into the test socket 610 when writing the firmware. A plurality of test sockets 610 can be mounted on the second test board 600. As illustrated in FIG. 3, the test sockets 610 can also be arranged two-dimensionally. In the example illustrated in FIG. 3, although the test sockets are arranged in two rows×three columns, the number of the test sockets and columns is not limited to this example, and the test sockets may also be arranged in a matrix of n rows×m columns (where n and m are integers equal to or more than 1). Moreover, as illustrated in FIG. 5, the DUT 10 is inserted into the test socket 610 via a connection unit 615, such as a connection pin.

A first signal line L11 connects between the ASIC 700 and the test socket 410, and a second signal line L12 connects between the ASIC 700 and the first tester 300.

When writing the firmware to the DUT 10, the second tester 500 and the second test board 600 are used. A third signal line L13 directly connects between the test socket 610 and the second tester 500.

In the embodiments, for example, a memory bus wiring can be used for the first signal line L11 and the third signal line L13. If the DUT 10 is an NAND flash memory, the first signal line L11 and the third signal line L13 are NAND interface memory bus wirings. The NAND interface memory bus wiring is ordinary and simple wiring with which the NAND flash memory is provided, and it is an NAND flash memory interface in conformity with Toggle and ONFI standard provided with IO<7:0>, DQS, BDQS, CE, CLE, ALE, /RE, BRE, /WE, /WP, and R/B.

A host bus wiring can be used for the second signal line L12. However, in the case of the test system according to the embodiments, the wiring may be sufficient merely capable of transmitting ASIC control dedicated signals, such as an instruction to start the test from the first tester 300 to the ASIC 700 and a report of end of the test from the ASIC 700 to the first tester 300. Alternatively, a control wiring with which the ASIC 700 is provided can also be used for the second signal line L12.

When operating the test system according to the embodiments, the firmware is first written to the DUT 10 using the second tester 500 and the second test board 600.

Next, when the power is turned on while the DUT 10 to which the firmware has been written is inserted into the test socket 410 on the first test board 400, the ASIC 700 reads the firmware from the DUT 10 through the first signal line L11 as a start-up operation.

After the read of the firmware is ended, an instruction to start a test is provided from the first tester 300 to the ASIC 700 through the second signal line L12. Then, the ASIC 700 which has received the test start instruction starts the test for the DUT 10 mounted on the test socket 410 through the first signal line L11 on the basis of the test conditions specified in the firmware.

When the test is ended, the ASIC 700 writes a test result to the DUT 10 and further reports to the first tester 300 that the test of the DUT 10 has been ended.

According to the test system according to the embodiments, it is possible from the ASIC 700 mounted on the first test board 400 to execute the test according to the firmware, even for the DUT 10 including no ASIC inside.

Moreover, since the test system according to the embodiments requires no ASIC when writing the firmware to the DUT 10, the second tester 500, that is a general-purpose test apparatus, provided with the third signal line L13 can be used. Furthermore, by writing the firmware directly to the DUT 10, no dedicated wiring (e.g., a host bus wiring) is necessary between the ASIC 700 and the outside such as a second tester 500.

Alternatively, if different firmware is written to a plurality of DUTs 10, and the DUTs 10 are respectively inserted into the test sockets 410 on the first test board 400, and providing them the test start instruction, it is possible from the first tester 300 to execute different tests for the respective ASIC 700 in parallel.

(Device Under Test (DUT))

Figure 6A:
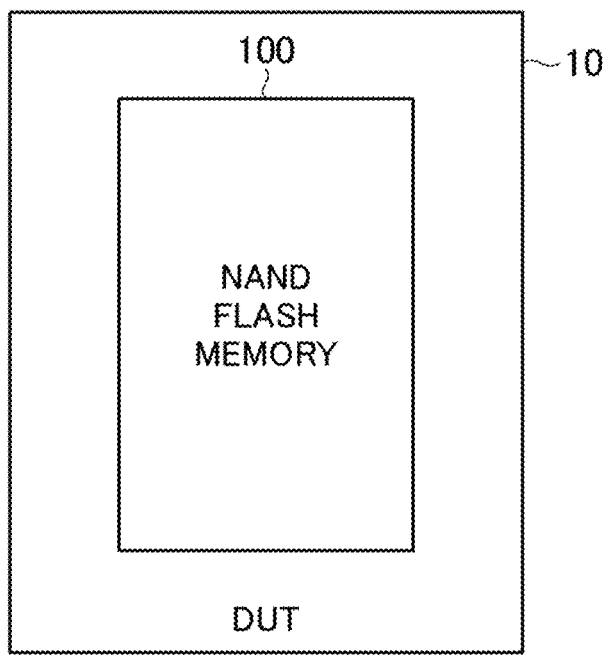
FIG. 6A is a block diagram schematically illustrating an example of a schematic structure of the DUT.

FIG. 6A illustrates an example of a schematic structure of a DUT 10, illustrating an example of a single NAND flash memory 100 as the device under test (DUT) 10.

Figure 6B:
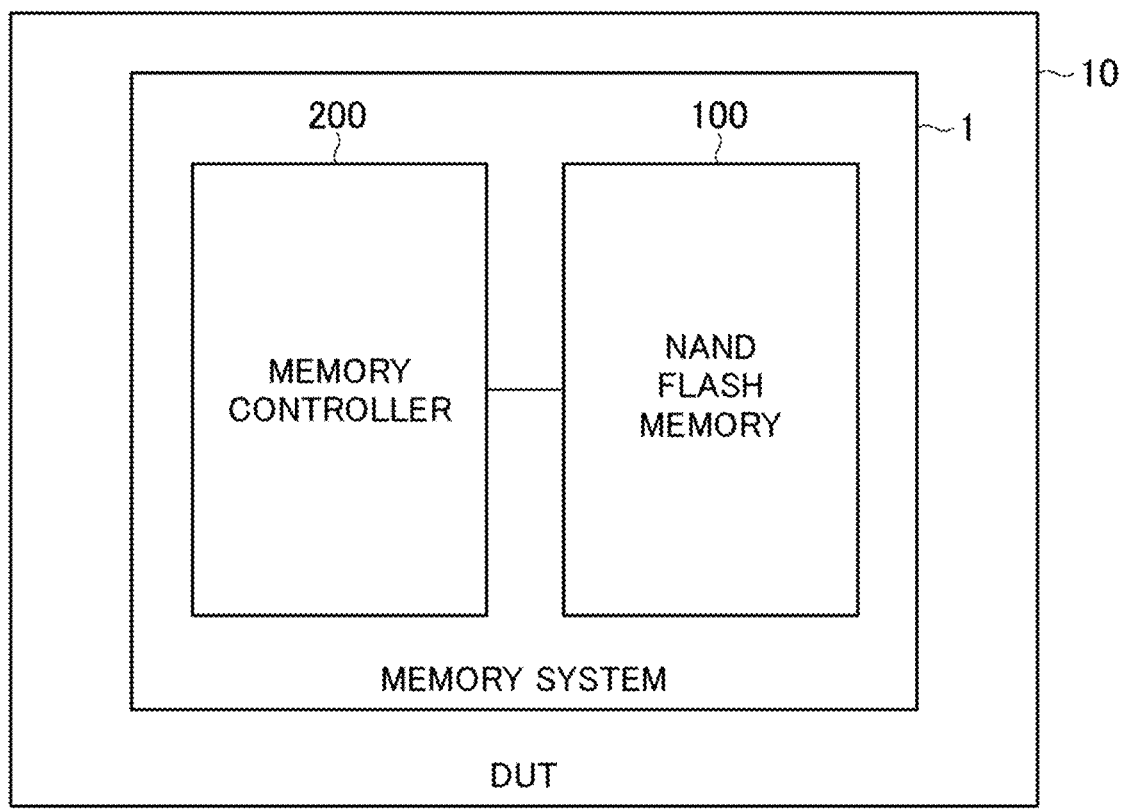
FIG. 6B is a block diagram schematically illustrating another example of a schematic structure of the DUT.

FIG. 6B illustrates an example of a memory system 1 provided with a NAND flash memory 100 and a memory controller 200 as a DUT 10. In this case, a signal of the host bus and a signal of the memory bus can be in direct communication with each other by configuring so that the memory controller 200 may be switched to a special test dedicated mode. By acting as if the entire memory system 1 operates as a single NAND flash memory 100, it is possible, from the ASIC 700, the first tester 300, and the second tester 500 without being conscious of distinguish between the single NAND flash memory 100 and the memory system 1, to handle both as a similar DUT 10.

(First Measuring Apparatus (First Tester))

Figure 7:
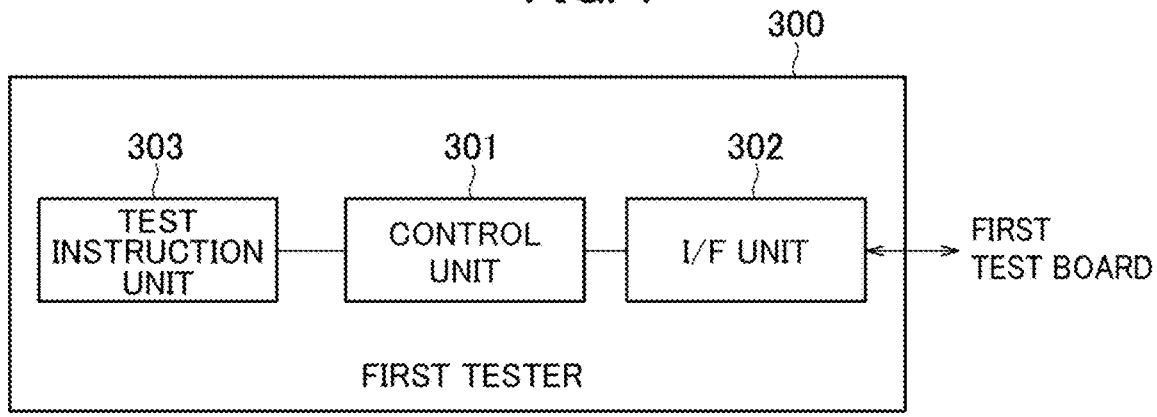
FIG. 7 is a block diagram schematically illustrating an example of an internal configuration of a first tester used for the test system according to the embodiments.

FIG. 7 illustrates an example of an internal configuration of a first tester 300 used for the test system according to the embodiments.

The first tester 300 includes a control unit 301, an interface (I/F) unit 302, and a test instruction unit 303. The control unit 301 controls each unit, i.e., the test instruction unit 303, the I/F unit 302, and the like, in the first tester 300. The I/F unit 302 provides an interface with the first test board 400. The test instruction unit 303 instructs the ASIC 700 mounted on the first test board 400 to start a test. Moreover, the test instruction unit 303 receives a report of end of the test from the ASIC 700 mounted on the first test board 400.

Since the first tester 300 can be tested at a lower cost than the second tester 500, there is a merit in reducing the cost required for the test by shifting test items from the second tester 500 to the first tester 300.

Since a DC parametric test cannot be executed if the first tester 300 and the ASIC 700 have no function for measuring electric current and voltage, in that case, the DC test can also be executed on the second tester 500.

(Second Measuring Apparatus (Second Tester))

Figure 8:
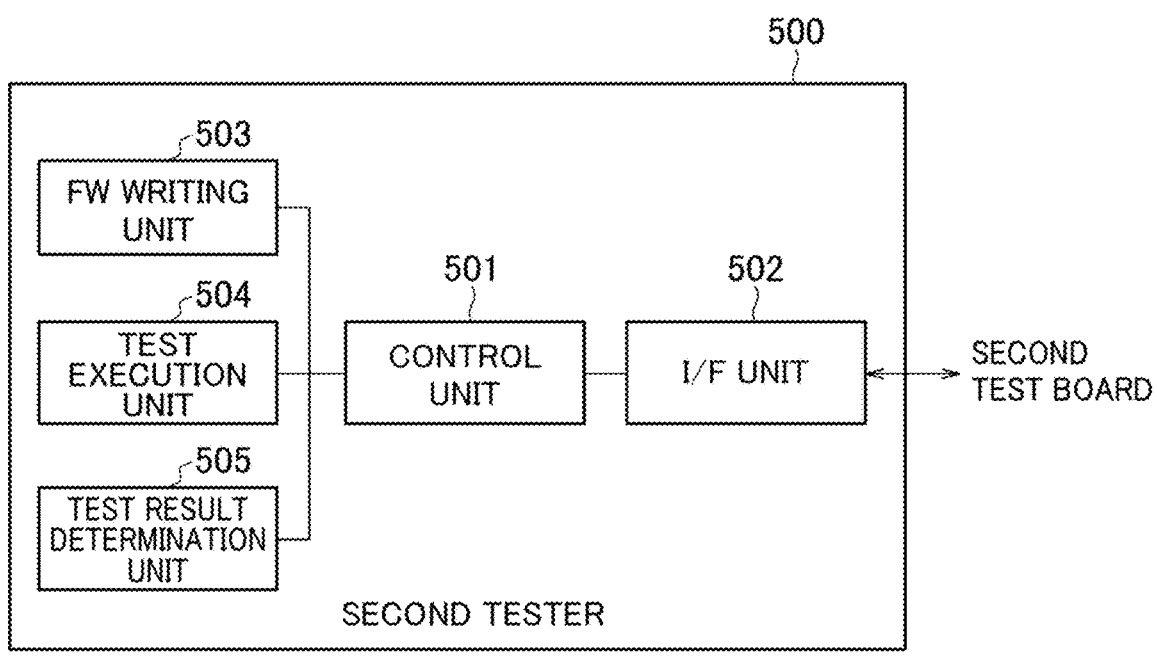
FIG. 8 is a block diagram schematically illustrating an example of an internal configuration of a second tester used for the test system according to the embodiments.

FIG. 8 illustrates an example of an internal configuration of a second tester 500 used for the test system according to the embodiments.

The second tester 500 includes a control unit 501, an interface (I/F) unit 502, a firmware writing unit 503, a test execution unit 504, and a test result determination unit 505. The control unit 501 controls each unit, i.e., the I/F unit 502, the firmware writing unit 503, the test execution unit 504, the test result determination unit 505, and the like, in the second tester 500. The I/F unit 502 provides an interface with the second test board 600. The firmware writing unit 503 writes the firmware to the DUT 10 mounted on the second test board 600.

Since the second tester 500 is an ordinary general-purpose memory tester, it can also execute a DC parametric test and a functional test of various NAND flash memories in addition to writing the firmware to the DUT 10. Tests for the same object and same conditions can also be executed as is on the second tester 500. Alternatively, the ASIC 700 mounted on the first tester 300 can also be made to test in accordance with the firmware written to the DUT 10. The test execution is executed by the test execution unit 504 and the determination of a test result is executed by the test result determination unit 505.

(Control Apparatus)

Figure 9:
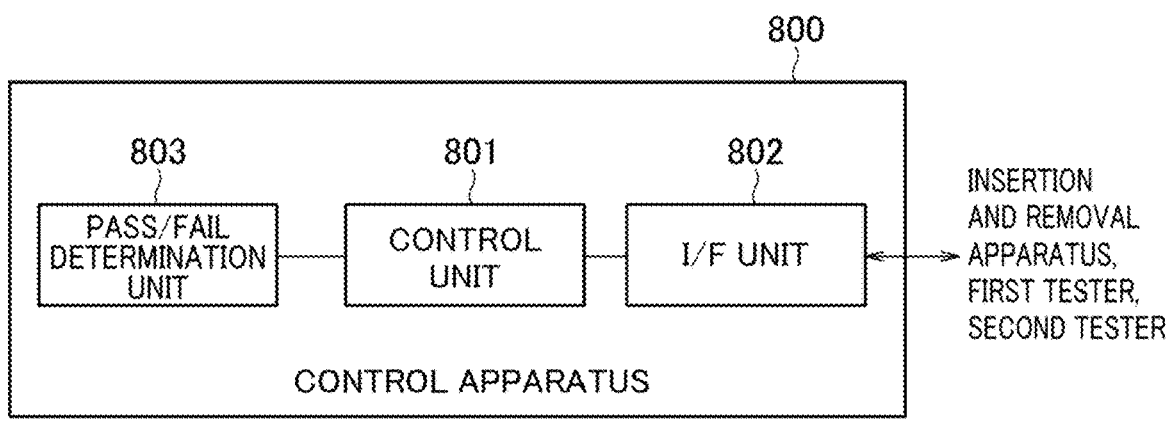
FIG. 9 is a block diagram schematically illustrating an example of an internal configuration of a control apparatus used for the test system according to the embodiments.

FIG. 9 illustrates an example of an internal configuration of a control apparatus 800 used for the test system according to the embodiments.

The control apparatus 800 includes a control unit 801, an interface (I/F) unit 802, and a pass/fail determination unit 803. The control unit 801 controls each unit, i.e., the I/F unit 802 and the pass/fail determination unit 803, in the control apparatus 800, and each unit, i.e., the first tester 300, the second tester 500, the insertion and removal apparatus 12, and the like, in the test system. The I/F unit 802 provides an interface with the first tester 300, the second tester 500, the insertion and removal apparatus 12, and the like. The pass/fail determination unit 803 determines pass/fail of the DUT 10 on the basis of a test result of the DUT.

Moreover, the control apparatus 800 controls the insertion and removal apparatus 12 to insert/remove one or more DUT(s) 10 into the test socket(s) 410 on the first test board 400 or the test socket(a) 610 on the second test board 600, per one DUT or per a plurality of DUTs.

(Test Executable Integrated Circuit (ASIC))

Figure 10:
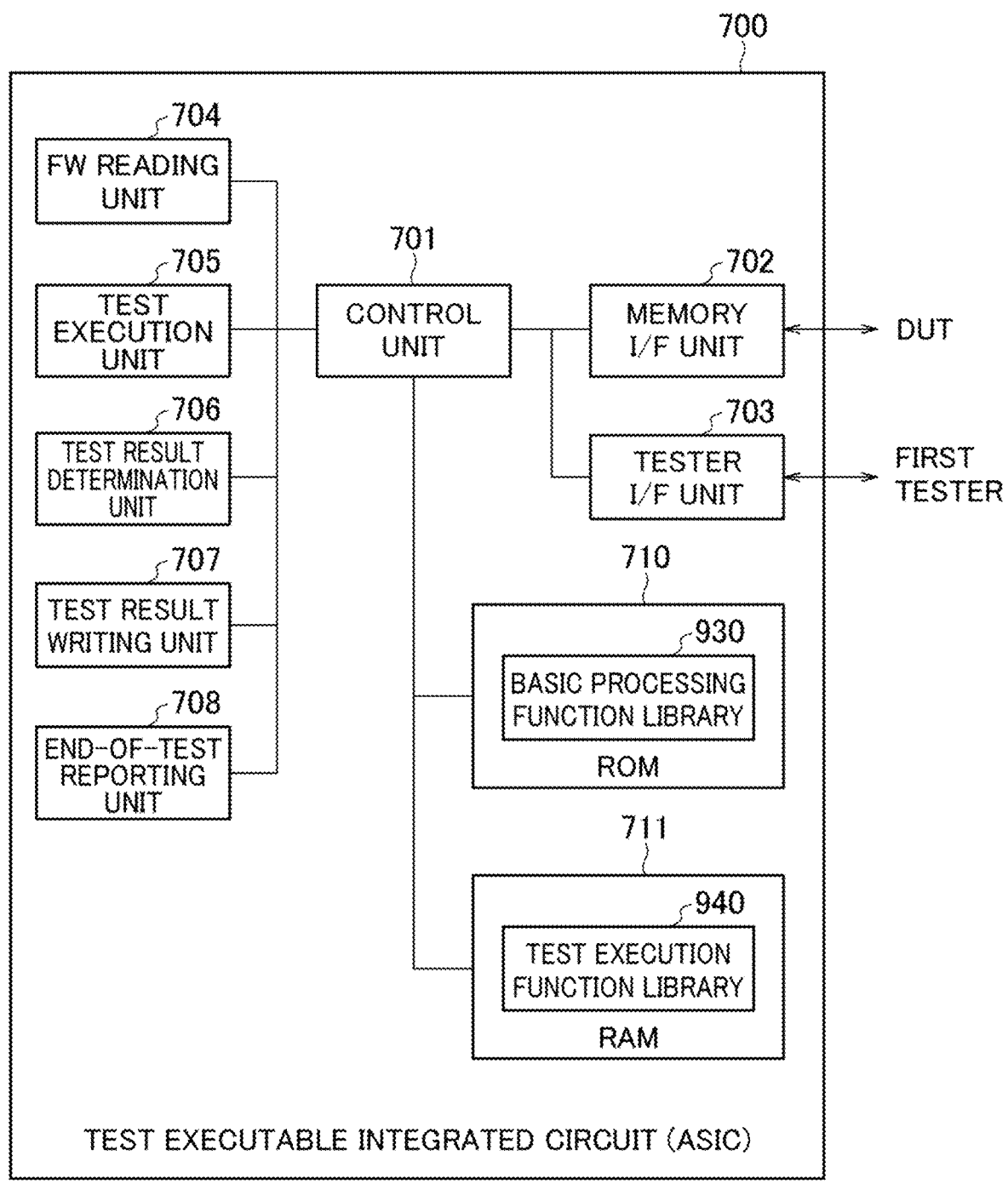
FIG. 10 is a block diagram schematically illustrating an example of an internal configuration of a test executable integrated circuit used for the test system according to the embodiments.

FIG. 10 illustrates an example of an internal configuration of a test executable integrated circuit (e.g., an ASIC) 700 used for the test system according to the embodiments.

The ASIC 700 includes a control unit 701, a memory interface (I/F) unit 702, a tester interface (I/F) unit 703, a firmware reading unit 704, a test execution unit 705, a test result determination unit 706, a test result writing unit 707, an end-of-test reporting unit 708, an ROM 710, and an RAM 711.

The control unit 701 controls each unit, i.e., the memory I/F unit 702, the tester I/F unit 703, the firmware reading unit 704, the test execution unit 705, the test result determination unit 706, the test result writing unit 707, the end-of-test reporting unit 708, and the like, in the ASIC 700. The memory I/F unit 702 provides an interface with the DUT 10. The tester I/F unit 703 provides an interface with the first tester 300.

The firmware reading unit 704 reads firmware (e.g., a test execution function) stored in advance in the DUT 10, and stores the read firmware in the test execution function library 940 in the RAM 711. Firmware (e.g., a basic processing function) serving as a basic of executing tests is recorded in the basic processing function library 930 in the ROM 710 in advance. The firmware will be described below.

The test execution unit 705 tests the DUT 10 in accordance with the firmware stored in the ROM 710 and the PAM 711. The test result determination unit 706 determines a result of the test of the DUT 10, and the test result writing unit 707 writes the test result to the DUT 10.

An end-of-test reporting unit 708 reports to the first tester 300 that the test has been ended.

(Firmware)

Figure 11:
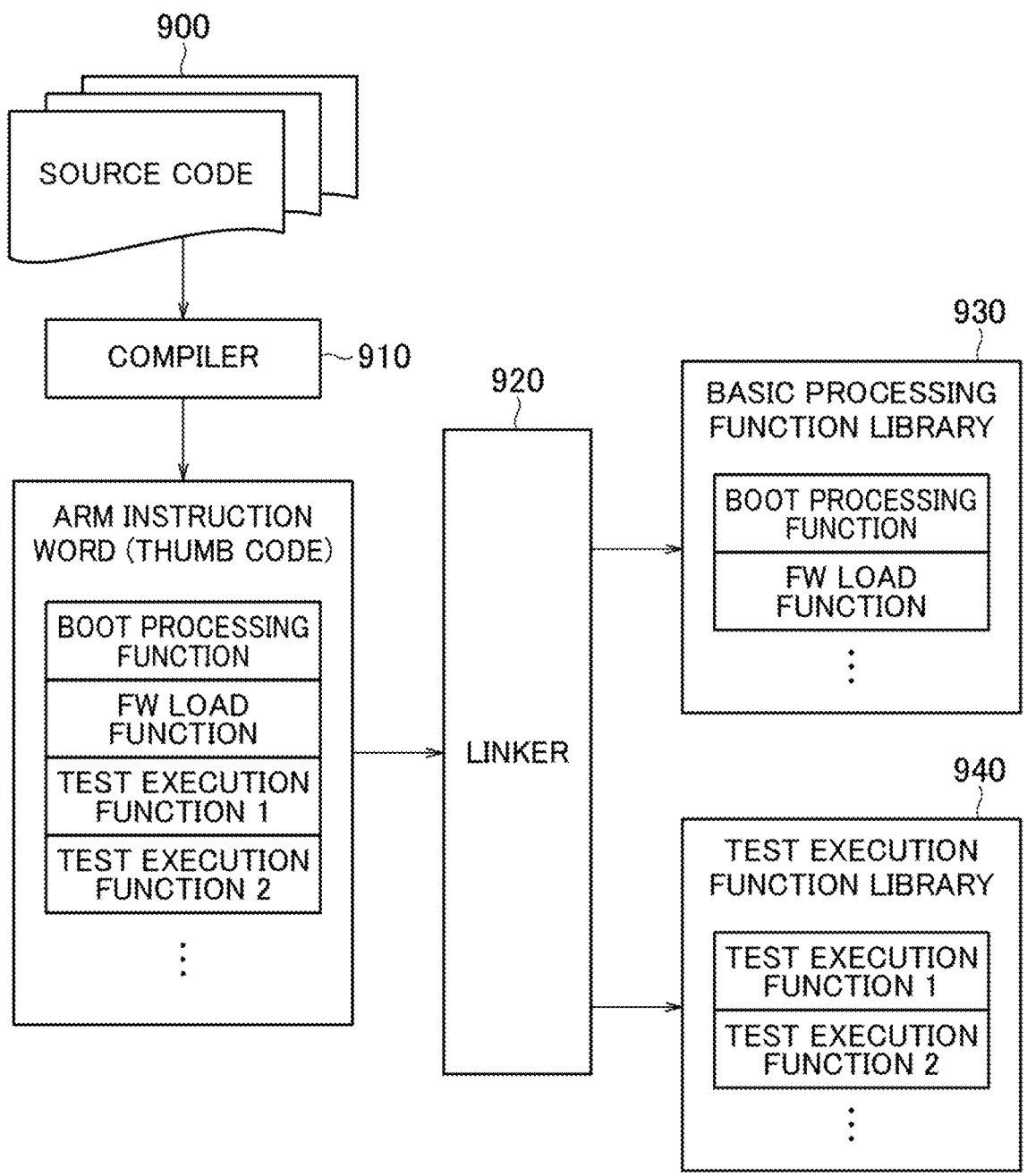
FIG. 11 is a schematic diagram illustrating a configuration example of firmware used for the test system according to the embodiments.

FIG. 11 illustrates a configuration example of firmware used for the test system according to the embodiments.

The firmware used for the test system according to the embodiments is instruction codes that can be interpreted and executed by the control unit 701 (e.g., CPU) mounted on the ASIC 700, and is composed of the basic processing function library (e.g., ROM code) 930 and the test execution function library (e.g., RAM code) 940.

The basic processing function library 930 is built-in, for example, as a circuit pattern on the ASIC 700. A boot processing function, a firmware load function, and the like are stored in the basic processing function library 930, for example.

The test execution function library 940 is read by the ASIC 700 from the DUT 10 as a start-up operation, and the code is loaded in a dedicated SRAM region prepared on the ASIC. In FIG. 11, the test execution functions 1 and 2 correspond to the firmware (e.g., RAM code) for executing the test in the ASIC 700. Specifically, in each test execution function, ASIC control instructions are stored to execute tests, such as an erase operation, a write operation, a read operation, a result determination, and the like, with respect to the DUT 10 (e.g., the NAND flash memory).

The firmware is translated from a state of a source code 900 into instruction words by the compiler 910, and is further linked and arranged by a linker 920 in the basic processing function library 930 and the test execution function library 940.

The control unit 701 (e.g., CPU) mounted on the ASIC 700 interprets and executes the instructions stored in the test execution functions 1, 2, and the like in the RAM code. The test execution unit 705 on the ASIC 700 repeats a process of issuing a series of operation command sequences to the DUT 10 (e.g., the NAND flash memory) through the memory I/F unit 702, or a process of reading output results from the NAND flash memory.

The test result determination unit 706 executes a data calculation process, such as a comparison between a result and expected value and a count of the number of Fail Bits, and then determines Pass/Fail) of the test result.

It is to be noted that, in order to execute a plurality of different test conditions (i.e., test items), individual test execution functions 1, 2, . . . , n are prepared in advance, and some or all of these functions can be executed sequentially and continuously.

Common examples of the test items include an electrical conductivity test, a DC test, a functional test, an AC test, a SCAN test (structural test), a power supply-related test, and the like. When the DUT 10 is an NAND flash memory, cell tests of the NAND memory include: a Pass/Fail test, such as SLC (1 bit/cell), MLC (2 bits/cell), TLC (3 bits/cell), and QLC (4 bits/cell); a test acceptable of a certain error as an error bit test; a fail-bit count test exceeding an ECC correction capability required for the cell test as a fail-bit count test; an Okay/No-Good determination test of tPROG criteria as a tPROG criteria test, and the like.

(Firmware Writing Process)

Figure 12:
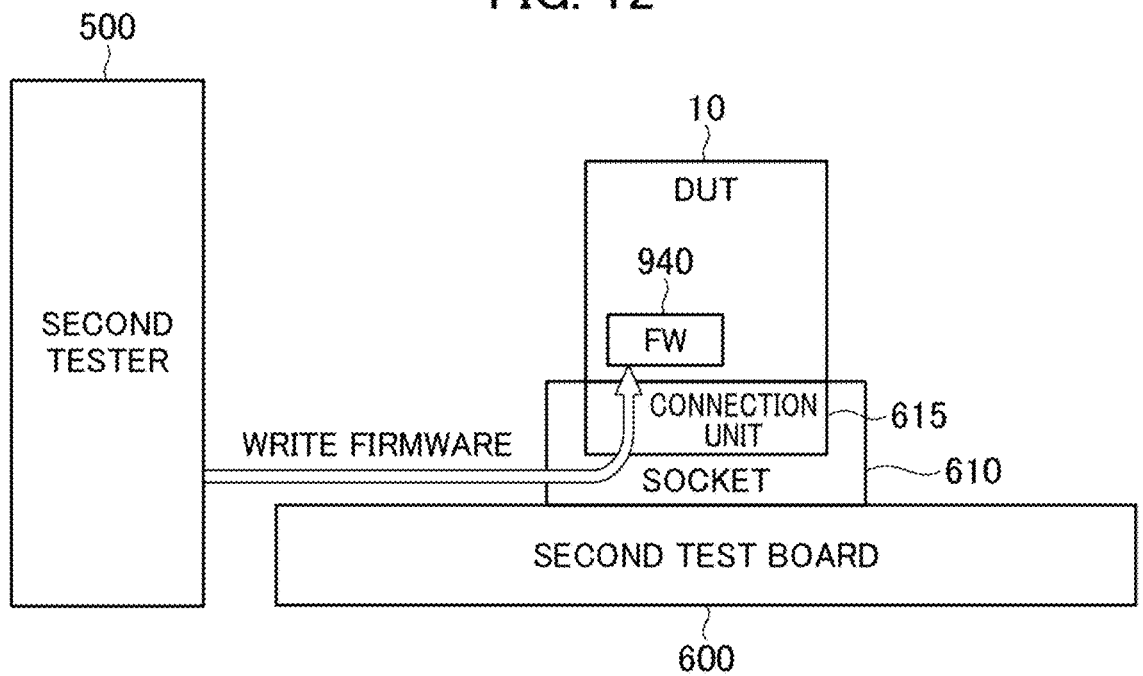
FIG. 12 is a schematic diagram illustrating an example of a process for writing firmware into a DUT.
Figure 13:
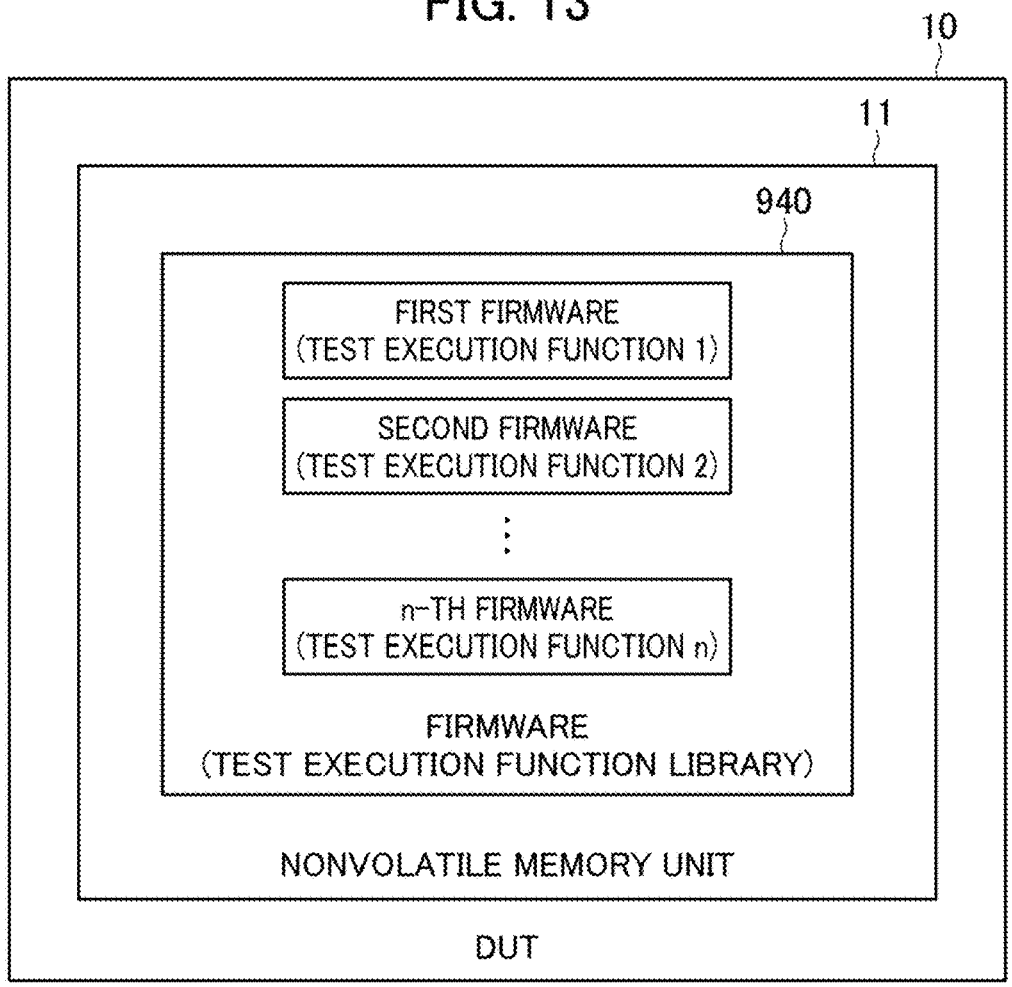
FIG. 13 is a block diagram schematically illustrating an example of a firmware library of the DUT.
Figure 14:
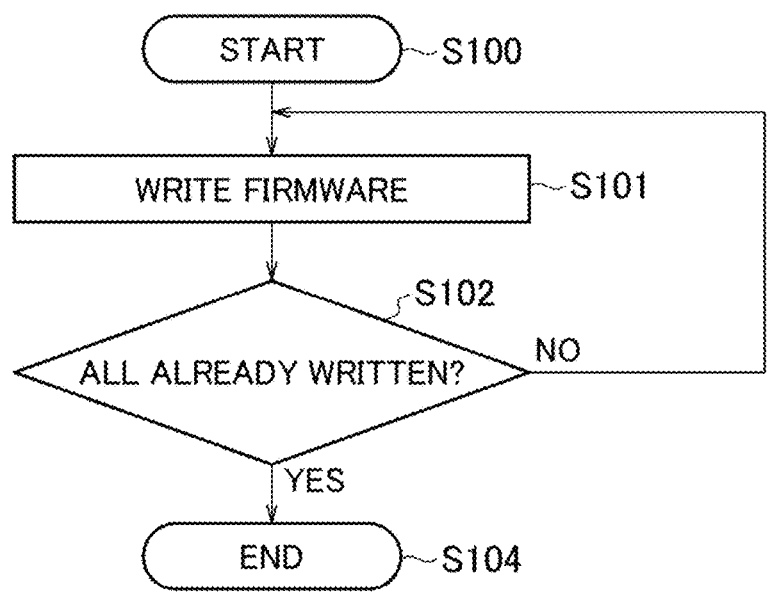
FIG. 14 is a flow chart illustrating an operation example of a process for writing the firmware into the DUT.

FIG. 12 schematically illustrates an example of a process of writing firmware to the DUT 10. FIG. 13 schematically illustrates an example of the firmware library 940 in the DUT 10. FIG. 14 illustrates an example of a process of writing the firmware to the DUT 10, and a main constituent of this process is the second tester 500.

When the DUT 10 is mounted on the test socket 610 disposed on the second test board 600 by the insertion and removal apparatus 12, a firmware writing process to be executed by the second tester 500 is started (Step S100).

In Step S101, the firmware writing unit 503 in the second tester 500 writes firmware (e.g., a test program) to the DUT 10 mounted on the test socket 610 disposed on the second test board 600.

In Step S102, the control unit 501 in the second tester 500 determines whether or not the firmware has written to each DUTs 10 mounted on the test socket 610.

If the firmware has been written in each DUTs 10 as a result of the determination in Step S102, the series of processes are ended (Step S104).

If there is DUT 10 to which no firmware is written as a result of the determination in Step S102, the firmware writing unit 503 returns to Step S101 and writes the firmware in the next DUT 10.

(Test Execution Processing for DUT)

Figure 15:
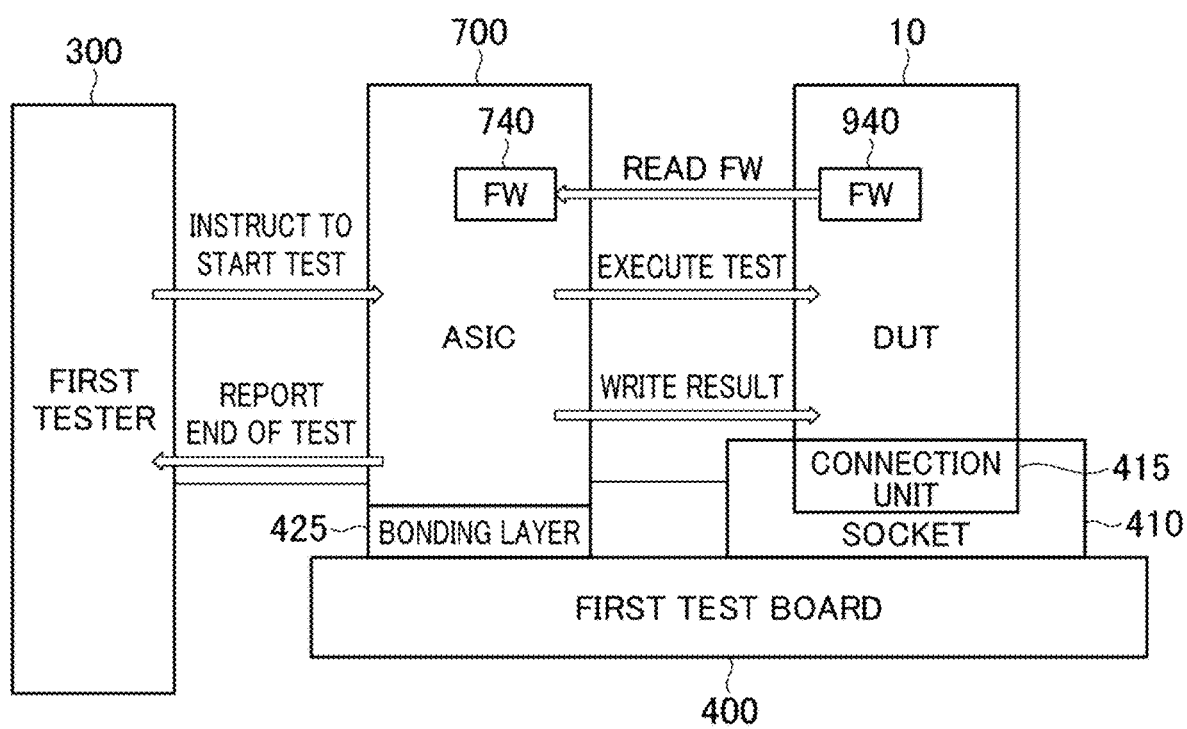
FIG. 15 is a schematic diagram illustrating an operation example of a process for executing a test of the DUT mounted on a first test board.
Figure 16:
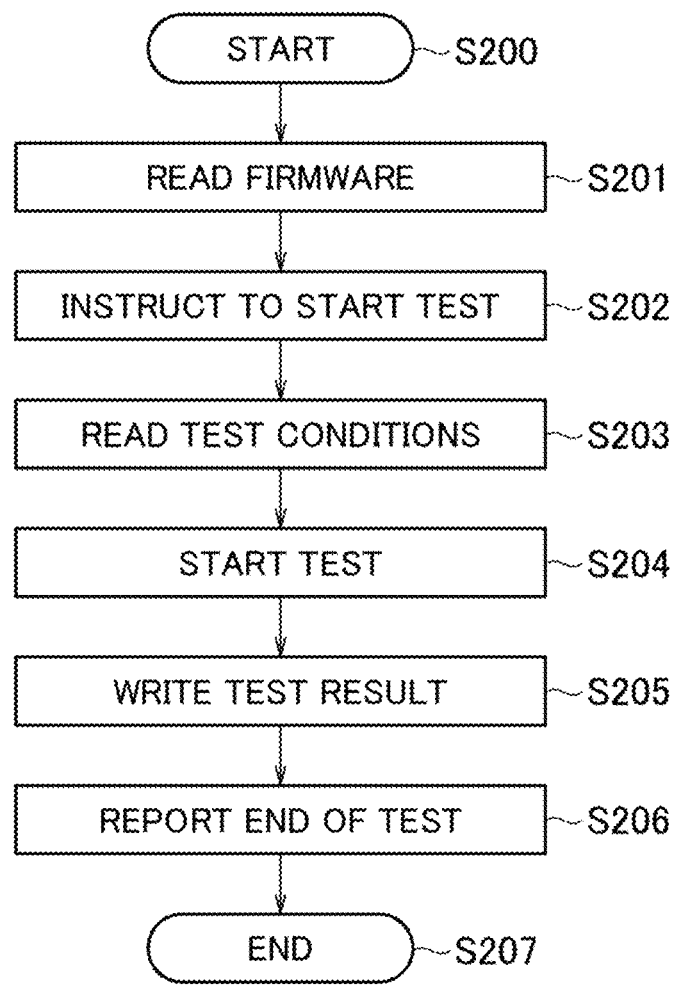
FIG. 16 is a flow chart illustrating an operation example of a process for executing a test of the DUT mounted on the first test board.

FIG. 15 illustrates an example of a process of executing a test of the DUT 10 mounted on the first test board 400. FIG. 16 illustrates an example of a process of executing a test of the DUT 10 mounted on the first test board 400, illustrating a case of single firmware. A main constituent of this process is the ASIC 700 mounted on the first test board 400.

When DUT 10 is mounted in the test socket 410 disposed on the first test board 400 by the insertion and removal apparatus 12, execution of the test for the DUT 10 to be executed by the first tester 300 will be started (Step S200).

In Step S201, the firmware reading unit 704 in the ASIC 700 reads the firmware stored in advance in the DUT 10.

In Step S202, the test instruction unit 303 in the first tester 300 instructs the ASIC 700 to start the test of the DUT 10.

In response to the test start instruction provided from the test instruction unit 303, the test execution unit 705 in the ASIC 700 reads test conditions from the test execution function library (e.g., RAM code) 940 in Step S203.

In Step S204, the test execution unit 705 in the ASIC 700 starts the test of the DUT 10 in accordance with the read test conditions.

After the test of the DUT 10 is ended, the test result determination unit 706 in the ASIC 700 determines a test result and the test result writing unit 707 writes the test result to the DUT 10, in Step S205.

Furthermore, in Step S206, the end-of-test reporting unit 708 in the ASIC 700 reports to the first tester 300 that the test of the DUT 10 has been ended, and ends the series of processes (Step S207).

Figure 17:
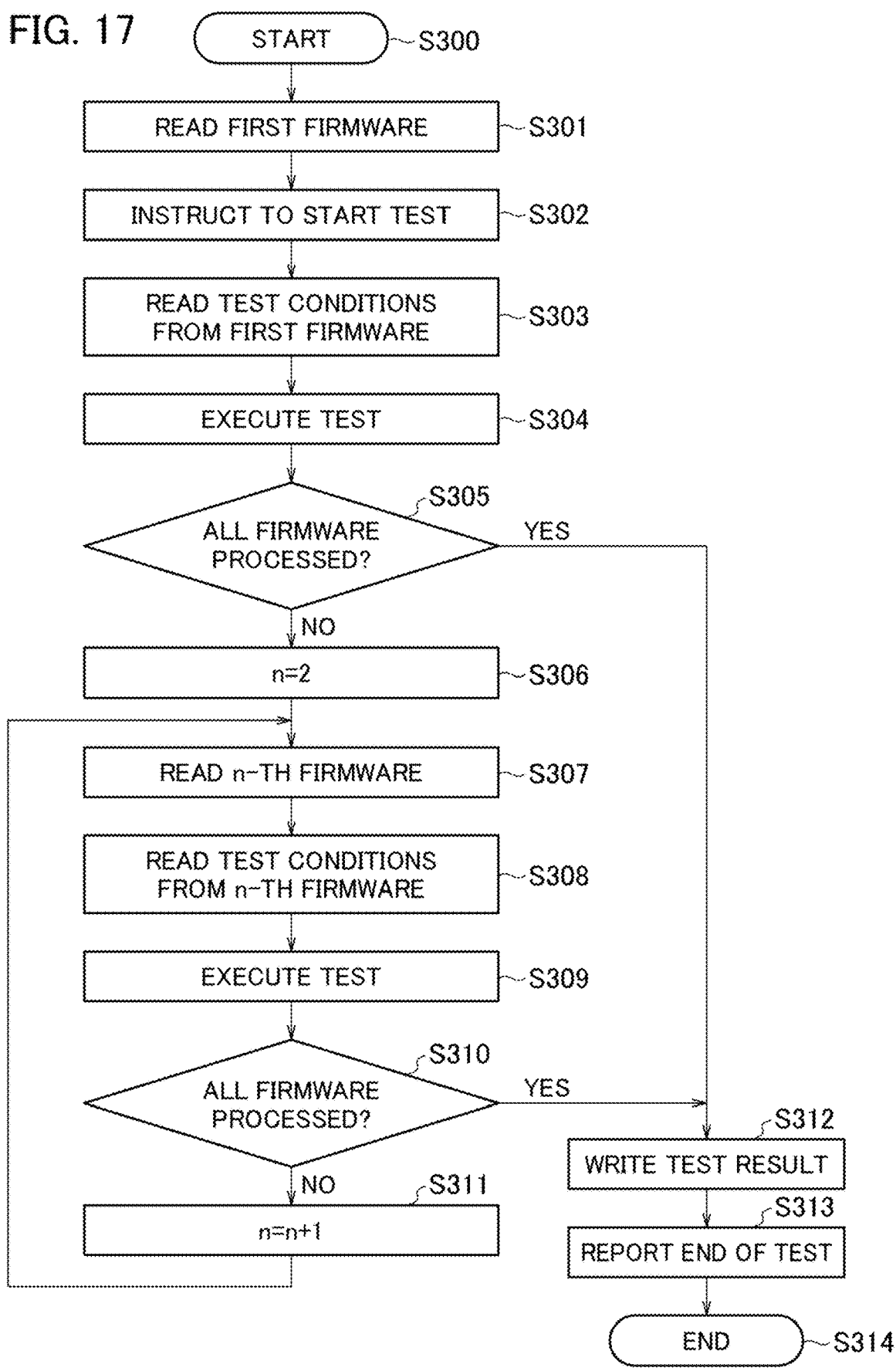
FIG. 17 is a flow chart illustrating another operation example of the process for executing the test of the DUT mounted on the first test board.

FIG. 17 illustrates another example of the process of executing the test of the DUT 10 mounted on the first test board 400, illustrating a case of a plurality of firmware. A main constituent of this process is also the ASIC 700 mounted on the first test board 400.

When DUT 10 is mounted in the test socket 410 disposed on the first test board 400 by the insertion and removal apparatus 12, execution of the test for the DUT 10 to be executed by the first tester 300 will be started (Step S300).

In Step S301, the firmware reading unit 704 in the ASIC 700 reads first firmware among the firmware stored in advance in the DUT 10 and stores the read first firmware in the test execution function library 940.

In Step S302, the test instruction unit 303 in the first tester 300 instructs the ASIC 700 to start the test of the DUT 10.

In response to the test start instruction provided from the test instruction unit 303, the test execution unit 705 in the ASIC 700 reads first test conditions from the test execution function library (e.g., RAM code) 940 in Step S303.

In Step S304, the test execution unit 705 in the ASIC 700 starts the test of the DUT 10 in accordance with the read test conditions.

In Step S305, the ASIC 700 determines whether or not all firmware stored in advance in the DUT 10 has already been processed.

If all firmware stored in advance in the DUT 10 has already been ended as a result of Step S305, the process proceeds to Step S312, and the test result determination unit 706 determines a test result and the test result writing unit 707 writes the test result to the DUT 10. Furthermore, in Step S313, the end-of-test reporting unit 708 reports to the first tester 300 that the test of the DUT 10 has been ended, and ends the series of processes (Step S314).

On the other hand, if there remains unprocessed firmware among the firmware stored in advance in the DUT 10 as a result of the determination of Step S305, it proceeds to Step S306 and the ASIC 700 sets 2 for the counter n.

In Step S307, the firmware reading unit 704 in the ASIC 700 reads n-th firmware (e.g., a second firmware if n=2) among the firmware stored in advance in the DUT 10 and stores the read n-th firmware in the test execution function library 940.

The test execution unit 705 reads test conditions of the n-th firmware from the test execution function library 940 in Step S308.

In Step S309, the test execution unit 705 in the ASIC 700 starts the test of the DUT 10 in accordance with the read test conditions.

In Step S310, the ASIC 700 determines whether or not all firmware stored in advance in the DUT 10 has already been processed.

If all firmware stored in advance in the DUT 10 has already been ended as a result of Step S310, the process proceeds to Step S312, and the test result determination unit 706 determines a test result and the test result writing unit 707 writes the test result to the DUT 10. Furthermore, in Step S313, the end-of-test reporting unit 708 reports to the first tester 300 that the test of the DUT 10 has been ended, and ends the series of processes (Step S314).

On the other hand, if unprocessed firmware remains among the firmware stored in advance in the DUT 10 as a result of the determination of Step S310, it proceeds to Step S311, the ASIC 700 adds 1 to the counter n, returns to Step S307, and executes the process for the next firmware (i.e., (n+1)-th firmware).

Figure 18:
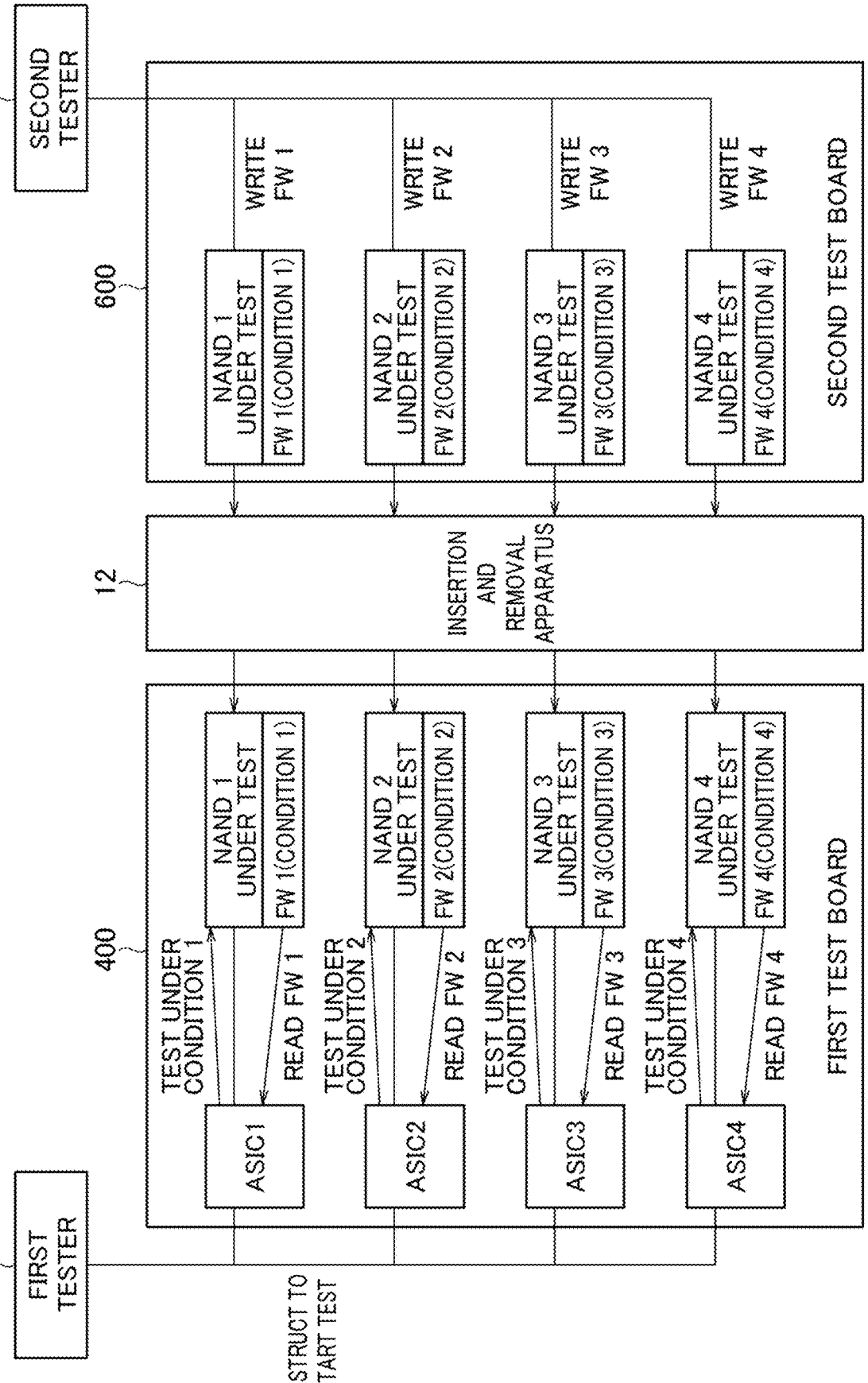
FIG. 18 is a schematic diagram illustrating an example of a process for executing in parallel a different test for each test executable integrated circuit.
Figure 19:
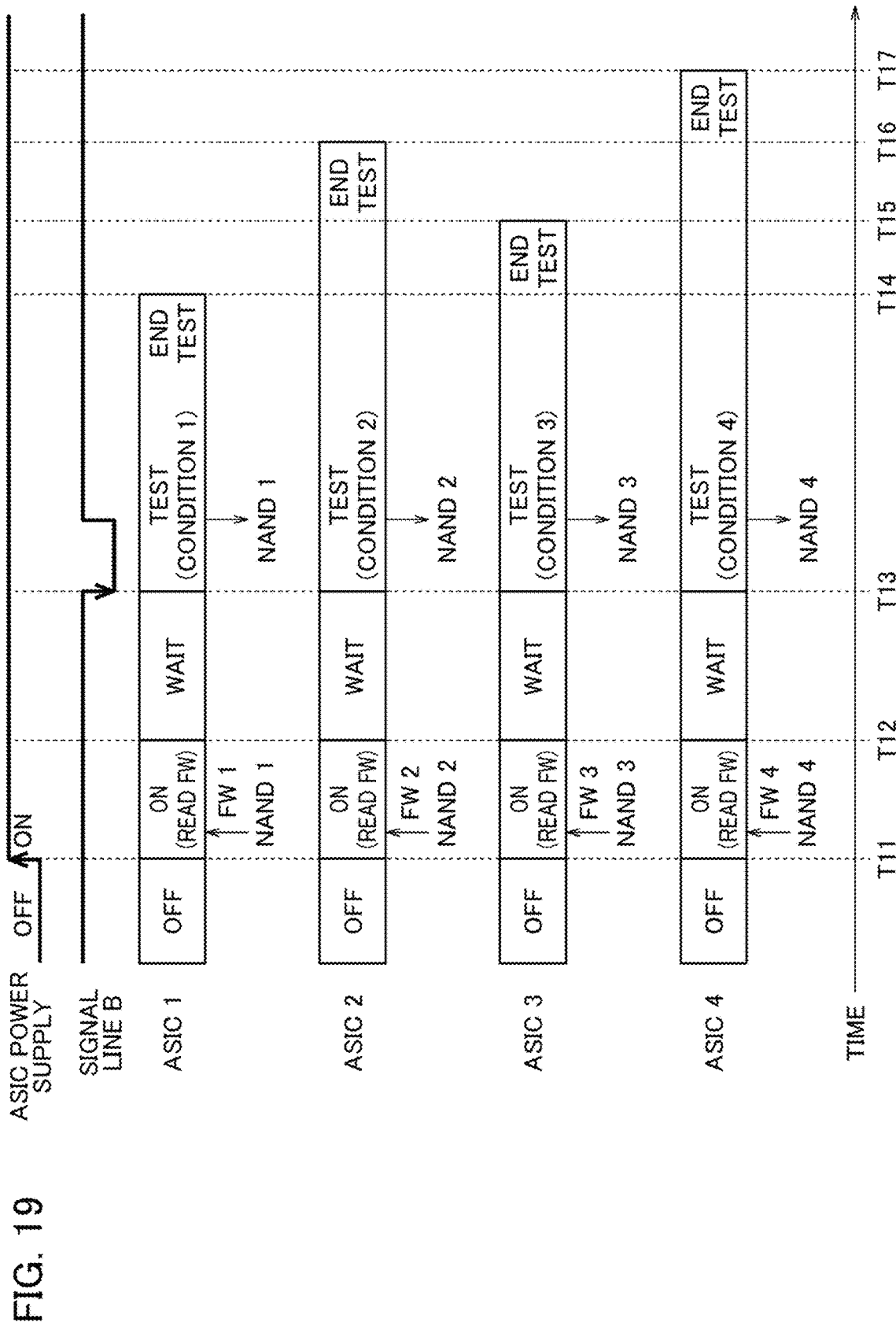
FIG. 19 is a timing chart illustrating an example of a process for executing in parallel a different test for each test executable integrated circuit.

FIG. 18 schematically illustrates an example of a process of executing in parallel a test with test conditions different respectively for a plurality of ASICs 700, and FIG. 19 is a timing chart thereof.

At time T11, when the power supply to the ASIC 700 is turned on, firmware 1 to firmware 4 are read in parallel from a plurality of ASICs 700, i.e., a NAND memory 1 to a NAND memory 4, which are DUTs 10, respectively corresponding to ASIC 1 to ASIC 4, and are respectively stored in the ASIC 1 to ASIC 4.

At time T12, when read operation of the firmware 1 to firmware 4 is completed, it is in a state of waiting for the test start instruction from the first tester 300.

At time T13, when the start of test is instructed by the first tester 300, the signal line B (i.e., the second signal line L12) falls, and in response, the ASIC 1 to ASIC 4 starts in parallel the tests (i.e., with test conditions 1 to 4) for the NAND memory 1 to NAND memory 4, which are DUTs 10.

Thereafter, the test of the NAND memory 1 is ended at time T14, the test of the NAND memory 3 is ended at time T15, the test of the NAND memory 2 is ended at time T16, and the test of the NAND memory 4 is ended at time T17. Variations in the end time are due to differences in the contents of test conditions 1 to 4, individual differences in the NAND memory 1 to NAND memory 4, and the like.

Although FIG. 19 illustrates an example of starting the read operation of the firmware 1 to 4 simultaneously at time T11 and starting the tests for the NAND memories 1 to 4 simultaneously at time T13, it is not necessary to simultaneously start them, and the start timing can also be shifted as required.

Figure 20:
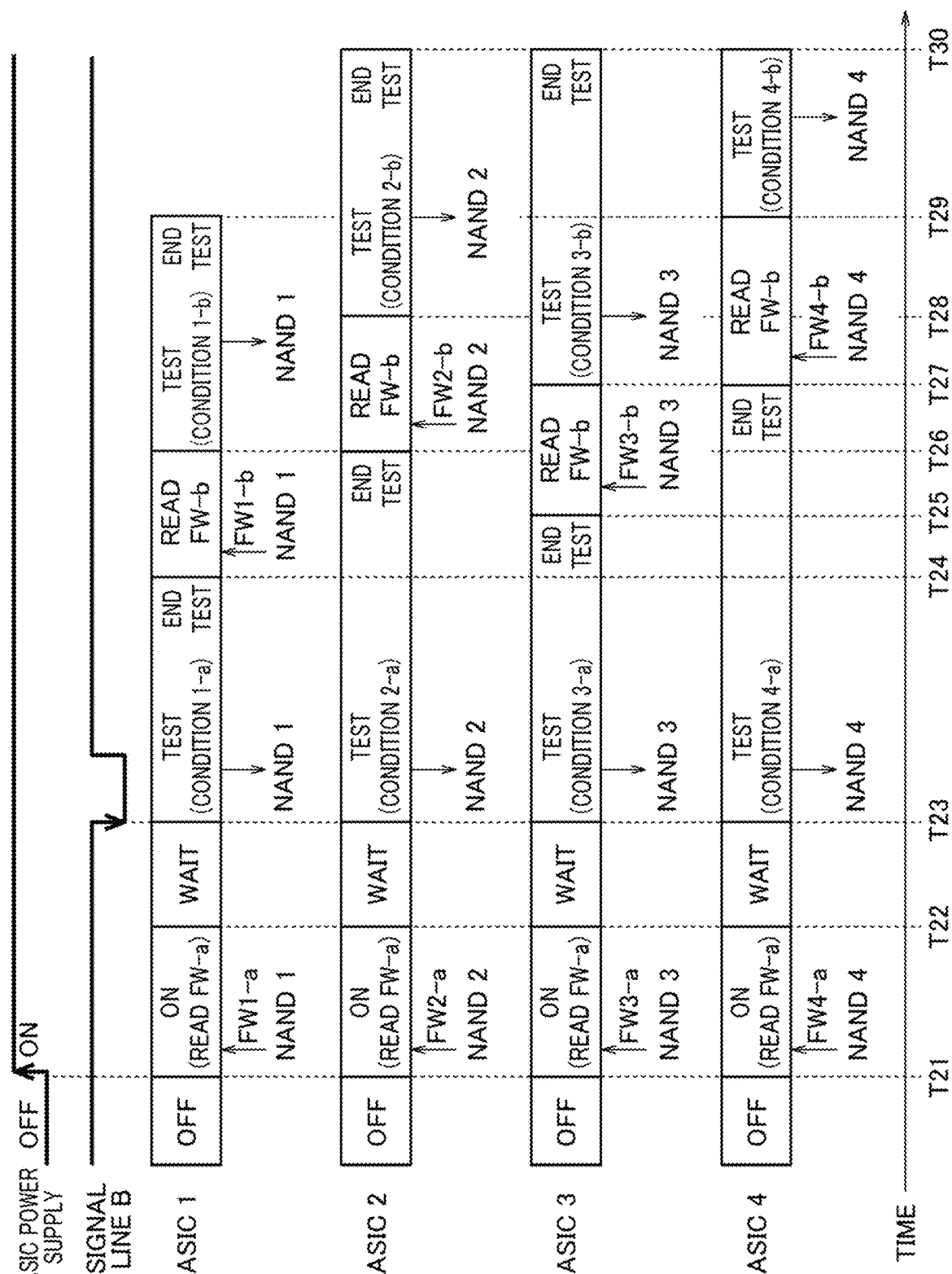
FIG. 20 is a timing chart illustrating another example of a process for executing in parallel a different test for each test executable integrated circuit.

FIG. 20 schematically illustrates an example of a process of executing in parallel tests with test conditions (there are a plurality of firmware) respectively different for a plurality of the ASICs 700.

At time T21, when the power supply to the ASIC 700 is turned on, first firmware 1-a, 2-a, 3-a, and 4-a are read in parallel from the NAND memory 1 to NAND memory 4 respectively corresponding to the ASIC 1 to ASIC 4, and are respectively stored in the ASIC 1 to ASIC 4.

At time T22, when read operation of the firmware 1-a to firmware 4-a is completed, it is in a state of waiting for the test start instruction from the first tester 300.

At time T23, when the start of test is instructed by the first tester 300, the signal line B (i.e., the second signal line L12) falls, and in response, the ASIC 1 to ASIC 4 starts in parallel the tests (i.e., test conditions 1-a, 2-a, 3-a, and 4-a) for the NAND memory 1 to NAND memory 4, which are DUTs.

Thereafter, the test (i.e., with test conditions 1-a) of the NAND memory 1 is ended at time T24, the ASIC 1 reads second firmware 1-b from the NAND memory 1 and starts a test (i.e., with test conditions 1-b) of the NAND memory 1 from time T26.

Similarly, the test (i.e., with test conditions 2-a) of the NAND memory 2 is ended at time T26, the ASIC 2 reads second firmware 2-b from the NAND memory 2 and starts a test (i.e., with test conditions 2-b) of the NAND memory 2 from time T28.

Similarly, the test (i.e., with test conditions 3-a) of the NAND memory 3 is ended at time T25, the ASIC 3 reads second firmware 3-b from the NAND memory 3 and starts a test (i.e., with test conditions 3-b) of the NAND memory 3 from time T27.

Similarly, the test (i.e., with test conditions 4-a) of the NAND memory 4 is ended at time T27, the ASIC 4 reads second firmware 4-b from the NAND memory 4 and starts a test (i.e., with test conditions 4-b) of the NAND memory 4 from time T29.

Although FIG. 20 illustrates an example of starting the read operation of the firmware 1 to 4 simultaneously at time T21 and starting the tests (i.e., with the test conditions 1-a, 2-a, 3-a, and 4-a) for the NAND memories 1 to 4 simultaneously at time T23, it is not necessary to simultaneously start them, and the start timing can also be shifted as required.

However, in the test system according to the embodiments, the first tester 300 merely provides the test start instruction, and to test the DUT 10 is the ASIC 700 that receives the instructions from the first tester 300. Therefore, even if the test system is configured to start the processes simultaneously as illustrated in FIG. 19 or 20, there is no concern about load concentration and the like.

It is to be noted that the processing operations illustrated in FIGS. 14 to 20 can also be described in a computer program as instructions to be executed by computers. The computer program is stored in, for example, a non-transitory computer readable medium and is used for the test system according to the embodiments.

Effects Produced from the Embodiments

According to the embodiments, the following effects can be obtained.

There is no need to provide a special signal line dedicated to the ASIC for writing the firmware. Therefore, resources such as test board wirings and tester pins can be reduced, and it is possible to expect increase in the number of DUTs that can be simultaneously measured and a reduction in test costs due to utilizing of inexpensive testers. Moreover, since it is configured to write the firmware to the DUT in advance, it leads also to reduction in the test time when the test is executed.

In general, tests using firmware have been limited to products where a DUT has a built-in ASIC. However, according to the embodiments, it is possible to expand DUTs also for products having no built-in ASIC, and it is possible to expect to unify test contents due to firmware, to improve quality by enhancing test contents, and to reduce costs by shortening test time.

Since it is configured to write different test conditions for each DUT in advance as the firmware, there is no need to set test conditions and determination conditions at the first tester side. Therefore, it is possible to simplify the configuration and control at the side of the first tester.

Moreover, since it is configured to write the test contents to the DUT or ASIC as firmware it is possible to conceal details of the test contents. Therefore, for example, even if outsourcing test implementation operations, and the like, there is no need to disclose information and is effective in terms of management of confidential information. More specifically, if the firmware is stored in a build-in format, for example, as a HEX file, it can prevent an unauthorized access for the firmware and the test contents can be kept confidential.

Conventionally, only one type of DUT could be tested in one test, but it is possible to collectively test a plurality of different DUTs at once. It is also expected to be used for a batch test of a wide variety of products in small quantities and standardization of test processes. That is, if a plurality of firmware is written to the DUT, it is possible to execute a plurality of tests.

While certain embodiments have been described, these embodiments have been presented by way of examples only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A test system comprising:
   a second test board on which a device under test is mounted;
   a second measuring apparatus connected to the device under test and configured to write firmware to the device under test mounted on the second test board, the device under test being removable from the second test board after the firmware is written to the device under test;
   a first test board on which the device under test removed from the second test board after the firmware is written is then mounted, the first test board being a different test board from the second test board;
   a test executable integrated circuit mounted on the first test board, the test executable integrated circuit configured to read the firmware stored in advance in the device under test and to execute a test of the device under test mounted on the first test board in accordance with the firmware; and
   a first measuring apparatus configured to instruct to start the test of the device under test to the test executable integrated circuit, the first measuring apparatus being a different measuring apparatus from the second measuring apparatus.

2. The test system according to claim 1 further comprising an insertion and removal apparatus configured to insert/removes the device under test into/from a test socket arranged on the first test board or a test socket arranged on the second test board.

3. The test system according to claim 1, wherein the test executable integrated circuit writes a result of the test to the device under test.

4. The test system according to claim 1, wherein the test executable integrated circuit reports to the first measuring apparatus that the test has been ended.

5. The test system according to claim 1, wherein the test executable integrated circuit is mounted on the first test board in correspondence with the device under test.

6. The test system according to claim 1, wherein conditions of the test are included in the firmware.

7. The test system according to claim 1 further comprising a control apparatus configured to determines pass/fail of the device under test on the basis of a test result of the device under test.

8. The test system according to claim 1, wherein the firmware includes instruction codes that can be interpreted and executed by the test executable integrated circuit, and the test executable integrated circuit tests the device under test in accordance with the instruction codes.

9. A test method comprising:
   mounting a device under test on a second test board;
   writing firmware to the device under test mounted on the second test board using a second measuring apparatus connected to the device under test;
   removing the device under test from the second test board after the firmware is written;
   mounting the device under test, removed from the second test board after the firmware is written, on a first test board on which a test executable integrated circuit is mounted, the first test board being a different test board from the second test board;
   reading, by the test executable integrated circuit, firmware stored in advance in the device under test mounted on the first test board;
   instructing, by the first measuring apparatus, the test executable integrated circuit to start a test of the device under test mounted on the first test board, the first measuring apparatus being a different measuring apparatus from the second measuring apparatus;
   testing, by the test executable integrated circuit in accordance with the firmware, the device under test mounted on the first test board; and
   writing, by the test executable integrated circuit, a test result to the device under test mounted on the first test board.

10. The test method according to claim 9 further comprising
    writing, by the test executable integrated circuit, a result of the test to the device under test.

11. The test method according to claim 9 further comprising
    reporting, by the test executable integrated circuit, to the first measuring apparatus that the test has been ended.

12. The test method according to claim 9 further comprising
    determining pass/fail of the device under test on the basis of a test result of the device under test.

13. The test method according to claim 9, wherein
    the firmware includes instruction codes that can be interpreted and executed by the test executable integrated circuit, and the test executable integrated circuit tests the device under test in accordance with the instruction codes.

14. A non-transitory computer readable medium in which a computer program is stored, the computer program being executed by a computer used for a test system for conducting a test for a device under test, the computer program comprising:
    mounting a device under test on a second test board; and
    writing firmware to the device under test mounted on the second test board using a second measuring apparatus connected to the device under test;
    removing the device under test from the second test board after the firmware is written;
    mounting the device under test, removed from the second test board after the firmware is written, on a first test board on which a test executable integrated circuit is mounted, the first test board being a different test board from the second test board;
    reading, by the test executable integrated circuit, firmware stored in advance in the device under test mounted on the first test board;
    instructing, by the first measuring apparatus, the test executable integrated circuit to start a test of the device under test mounted on the first test board, the first measuring apparatus being a different measuring apparatus from the second measuring apparatus;

testing, by the test executable integrated circuit in accordance with the firmware, the device under test mounted on the first test board; and writing, by the test executable integrated circuit, a test result to the device under test mounted on the first test board.

15. The non-transitory computer readable medium according to claim 14, the computer program further comprising writing, by the test executable integrated circuit, a result of the test to the device under test.

16. The non-transitory computer readable medium according to claim 14, the computer program further comprising reporting, by the test executable integrated circuit, to the first measuring apparatus that the test has been ended.

17. The non-transitory computer readable medium according to claim 14, the computer program further comprising determining pass/fail of the device under test on the basis of a test result of the device under test.

18. The non-transitory computer readable medium according to claim 14, wherein the firmware includes instruction codes that can be interpreted and executed by the test executable integrated circuit, and the test executable integrated circuit tests the device under test in accordance with the instruction codes.

* * * * *